United States Patent
Biber et al.

(10) Patent No.: US 10,247,792 B2
(45) Date of Patent: Apr. 2, 2019

(54) FIELD-COUPLED CONNECTION TECHNIQUE FOR LINKING COILS AND/OR PATIENT TABLES IN MAGNETIC RESONANCE IMAGING

(71) Applicants: Stephan Biber, Erlangen (DE); Ralph Oppelt, Uttenreuth (DE)

(72) Inventors: Stephan Biber, Erlangen (DE); Ralph Oppelt, Uttenreuth (DE)

(73) Assignee: Siemens Aktiengesellschaft, München (DE)

( * ) Notice: Subject to any disclaimer, the term of this patent is extended or adjusted under 35 U.S.C. 154(b) by 985 days.

(21) Appl. No.: 14/716,552

(22) Filed: May 19, 2015

(65) Prior Publication Data

US 2015/0331074 A1   Nov. 19, 2015

(30) Foreign Application Priority Data

May 19, 2014  (DE) .................. 10 2014 209 457

(51) Int. Cl.
*G01R 33/36*   (2006.01)
*G01R 33/341*  (2006.01)

(52) U.S. Cl.
CPC ......... *G01R 33/36* (2013.01); *G01R 33/3642* (2013.01); *G01R 33/341* (2013.01)

(58) Field of Classification Search
CPC ... G01R 33/36; G01R 33/341; G01R 33/3642
See application file for complete search history.

(56) References Cited

U.S. PATENT DOCUMENTS

| | | | | |
|---|---|---|---|---|
| 4,972,852 A | * | 11/1990 | Koob ................. | A61B 5/04004 5/600 |
| 5,551,430 A | * | 9/1996 | Blakeley .............. | A61B 5/0555 324/318 |
| 5,903,151 A | * | 5/1999 | Potthast ............ | G01R 33/3621 324/318 |
| RE36,495 E | * | 1/2000 | Blakeley .............. | A61B 5/0555 324/318 |
| 6,362,622 B1 | * | 3/2002 | Stauber ................. | G01R 33/36 324/318 |
| 7,609,063 B2 | * | 10/2009 | Xue ..................... | G01R 33/307 324/318 |
| 7,722,375 B2 | * | 5/2010 | Hagen ............. | G01R 33/34007 324/318 |
| 7,999,549 B2 | * | 8/2011 | Weiss ..................... | G01R 33/36 324/318 |

(Continued)

FOREIGN PATENT DOCUMENTS

| | | |
|---|---|---|
| DE | 10130615 A1 | 1/2003 |
| DE | 10314215 B4 | 11/2006 |
| WO | WO2009069097 A1 | 6/2009 |

OTHER PUBLICATIONS

German Office Action for German Application No. 10 2014 209 457.7, dated Dec. 17, 2014, with English Translation.

*Primary Examiner* — Dixomara Vargas
(74) *Attorney, Agent, or Firm* — Lempia Summerfield Katz LLC

(57) ABSTRACT

A magnetic resonance imaging (MRI) system connection for a magnetic resonance imaging system, such as for an MRI local coil and/or patient couch, is provided. The MRI system connection is embodied with devices for a field-coupled transmission of signals.

20 Claims, 3 Drawing Sheets

(56) References Cited

U.S. PATENT DOCUMENTS

| | | | | |
|---|---|---|---|---|
| 8,019,403 B2* | 9/2011 | Demharter | ............ | A61B 5/0002 |
| | | | | 455/423 |
| 8,384,388 B2* | 2/2013 | Biber | ................ | G01R 33/3415 |
| | | | | 324/318 |
| 8,564,291 B2* | 10/2013 | Nelson | ................. | A61B 5/0428 |
| | | | | 324/309 |
| 8,803,525 B2* | 8/2014 | Baumgartl | ......... | G01R 33/3664 |
| | | | | 324/318 |
| 9,352,148 B2* | 5/2016 | Stevenson | ................ | A61N 1/08 |
| 9,810,752 B2* | 11/2017 | Biber | ................... | G01R 33/341 |
| 2003/0016017 A1 | 1/2003 | Reykowski et al. | | |
| 2005/0127914 A1 | 6/2005 | Eberler et al. | | |

\* cited by examiner

FIELD-COUPLED CONNECTION TECHNIQUE FOR LINKING COILS AND/OR PATIENT TABLES IN MAGNETIC RESONANCE IMAGING

This application claims the benefit of DE 10 2014 209 457.7, filed on May 19, 2014, which is hereby incorporated by reference in its entirety.

BACKGROUND

The present embodiments relate to a magnetic resonance imaging system connection and a magnetic resonance imaging system.

Magnetic resonance imaging apparatuses (MRIs or magnetic resonance imaging systems) for examining objects or patients by magnetic resonance imaging are known, for example, from DE 103 14 215 B4.

SUMMARY

The scope of the present invention is defined solely by the appended claims and is not affected to any degree by the statements within this summary.

The present embodiments may obviate one or more of the drawbacks or limitations in the related art. For example, connections in a magnetic resonance imaging (MRI) system are optimized.

DETAILED DESCRIPTION

Figure 5:
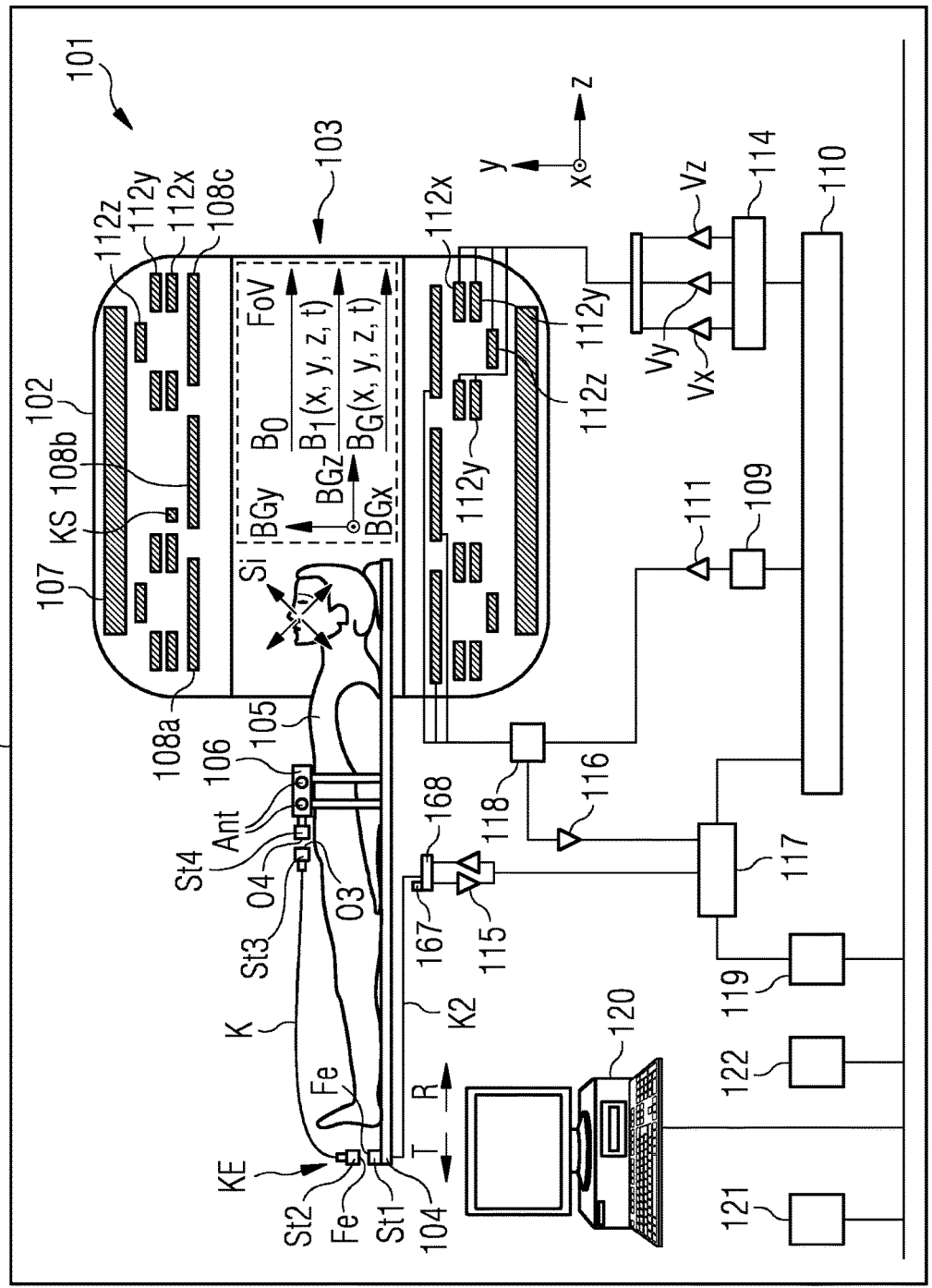
FIG. 5 schematically shows an exemplary MRI system.

FIG. 5 shows one embodiment of a magnetic resonance imaging apparatus MRI 101 (e.g., situated in a shielded area or Faraday cage F) including a hollow cylinder 102 with, for example, a tubular space 103, into which a patient couch 104 with a body 105 (e.g., of an examination object such as a patient; with or without a local coil arrangement 106) may be moved in the direction of the arrow z in order to generate recordings of the patient 105 using an imaging method. A local coil arrangement 106 may be arranged on the patient and may be used to generate, in a local region (e.g., field of view (FOV)) of the MRI, recordings of a partial region of the body 105 in the FOV. Signals of the local coil arrangement 106 may be evaluated (e.g., converted into images, stored or displayed) by an evaluation device (e.g., including elements 168, 115, 117, 119, 120, 121, etc.) of the MRI apparatus 101. The evaluation device may be connected to the local coil arrangement 106 (e.g., via coaxial cables or by radio (element 167)).

In order to use a magnetic resonance imaging apparatus MRI 101 to examine a body 105 (e.g., an examination object or a patient) using magnetic resonance imaging, various magnetic fields coordinated very accurately with one another in terms of temporal and spatial characteristic are radiated onto the body 105. A strong magnet (e.g., a cryomagnet 107) in a measuring cabin having an opening 103 in the form of a tunnel generates a static strong main magnetic field $B_0$ that has a value of, for example, 0.2 tesla to 3 teslas or even more. A body 105 to be examined is laid on a patient couch 104 and moved into a region of the main magnetic field $B_0$ that is approximately homogeneous in the field of view FoV. The nuclear spins of atomic nuclei of the body 105 are excited by magnetic radio-frequency excitation pulses $B1(x, y, z, t)$ that are radiated in by a radio-frequency antenna (and/or, if appropriate, a local coil arrangement). The radio-frequency antenna is illustrated in a very simplified fashion as body coil 108 (e.g., multipart body coil 108$a$, 108$b$, 108$c$). Radio-frequency excitation pulses are generated by a pulse generating unit 109, for example, that is controlled by a pulse sequence control unit 110. After amplification by a radio-frequency amplifier 111, the radio-frequency excitation pulses are conducted to the radio-frequency antenna 108. The radio-frequency system shown is merely indicated schematically. In other embodiments, more than one pulse generating unit 109, more than one radio-frequency amplifier 111, and a plurality of radio-frequency antennas 108$a$, $b$, $c$ are also used in a magnetic resonance imaging apparatus 101.

The magnetic resonance imaging apparatus 101 has gradient coils 112$x$, 112$y$, 112$z$, by which magnetic gradient fields $B_G(x, y, z, t)$ for selective slice excitation and for spatial encoding of the measurement signal are radiated in during a measurement. The gradient coils 112$x$, 112$y$, 112$z$ are controlled by a gradient coil control unit 114 (and, if appropriate, by amplifiers Vx, Vy, Vz), which, like the pulse generating unit 109, is connected to the pulse sequence control unit 110.

Signals emitted by the excited nuclear spins (e.g., of the atomic nuclei in the examination object) are received by the body coil 108 and/or at least one local coil arrangement 106, amplified by assigned radio-frequency preamplifiers 116, and processed further and digitized by a receiving unit 117. The recorded measurement data are digitized and stored as complex numerical values in a k-space matrix. From the k-space matrix occupied by values, an associated MR image may be reconstructed by a multidimensional Fourier transformation.

For a coil that may be operated both in the transmission mode and in the reception mode, such as, for example, the body coil 108 or a local coil 106, the correct signal forwarding is regulated by a transmission/reception switch 118 connected upstream.

An image processing unit 119 generates an image from the measurement data. The image is displayed to a user by an operating console 120 and/or is stored in a storage unit 121. A central computer unit 122 controls the individual installation components.

In MR imaging, images with a high signal/noise ratio (SNR) may be recorded by local coil arrangements (e.g., coils, local coils). These are antenna systems that are fitted in direct proximity on (anterior) or under (posterior), at, or in the body 105. During an MR measurement, the excited nuclei induce a voltage in the individual antennas of the local coil. The induced voltage is amplified by a low-noise preamplifier (e.g., LNA, preamp) and is forwarded to the reception electronics. In order to improve the signal/noise ratio even in the case of high resolution images, use is made of high-field installations (e.g., 1.5 T-12 T or more). If the number of individual antennas that may be connected to an MR reception system is more than the number of receivers present (e.g., a switching matrix; RCCS) is incorporated between reception antennas and receivers. The switching matrix routes the instantaneously active reception channels (e.g., the reception channels that currently lie in the field of view of the magnet) to the receivers present. As a result, more coil elements than the number of receivers present may be connected, since, in the case of whole body coverage, only the coils that are situated in the FoV or in the homogeneity volume of the magnet are to be read out.

Local coil arrangement 106, for example, may denote an antenna system that may include, for example, one antenna element or, as an array coil, a plurality of antenna elements (e.g., coil elements). These individual antenna elements are embodied, for example, as loop antennas (e.g., loops), butterfly, flexible coils or saddle coils. A local coil arrangement includes, for example, coil elements, a preamplifier, further electronics (e.g., standing wave traps, etc.), a housing, supports and may include a cable K, K2 with plug, by which the local coil arrangement is connected to the MRI installation. A receiver 168 fitted to the installation filters and digitizes a signal received from a local coil 106, for example, by radio, etc. and transfers the data to a digital signal processing device. The digital signal processing device may derive an image or spectrum from the data obtained by a measurement and makes the derived image or spectrum available to the user, for example, for subsequent diagnosis by the user and/or storage.

FIGS. 1-5 show configurations of one or more of the present embodiments.

Magnetic resonance imaging (MRI) systems such as, for example, the magnetic resonance imaging system 101 in FIG. 5 include a number of subcomponents that are not fixedly connected to the system and may or must transmit radio-frequency signals (RF, such as $B1(x, y, z, t)$, Si, T, R). These include local coils 106, the patient couch 104, and devices for monitoring the patient (e.g., an ECG or respiration sensor). Expenditure is incurred on account of the connection technique (e.g., plugs and sockets) since, for example, the regions accessible to the user are to withstand stringent requirements (e.g., >10 000 plugging cycles, cleanability and disinfectability, low contamination, robustness (plugs are to not break/bend, even in the event of rough handling), protection against electric shock and biocompatibility of the housings according to IEC, radio-frequency properties (low damping, impedance-matched), production properties such as low procurement and processing (assembly) costs).

One example of a mobile patient couch 104 allows the transmitting of RF signals ($B1(x, y, z, t)$ T, R, Si) via ninety-six coaxial plug connectors distributed over eight coil plugs. The number of plug connectors for the mobile patient couch 104 may be doubled again by a docking site (e.g., an interface such as at a patient couch). It is advantageous to improve the cost position and the reliability of a plug system (e.g., plug+socket).

According to prior art, galvanic plug connectors according to the "male"-"female" principle exist. Also known are plug connectors in which contacts sprung on one side impinge on the landing areas of a printed circuit board (PCB). As a result, on one side of the plug connection, the female side may be replaced by a PCB. These systems are used to transmit DC and AC current (<100 kHz) and RF signals (1 MHz-300 GHz). In one embodiment, capacitive couplers may be used at a local coil without preamplification.

The following, for example, may be important in connection technology for use in MR: low susceptibility of the reflection and transmission properties to vibrations; and low emission toward the outside at the Lamor frequency.

One configuration of one or more of the present embodiments provides a plug connector technique for a magnetic resonance imaging system connection (K, St1, St2; St3, St4; St5; St6) for a magnetic resonance imaging system (101), in which some or all radio-frequency portions of the signals to be transmitted (e.g., received signals Si, R from a body 104 and/or driving signals $B1(x, y, z, t)$, T etc.) are transmitted by an inductive or capacitive coupling (e.g., non-galvanic coupling) by a magnetic resonance imaging system connection (e.g., if appropriate by the devices thereof such as cables K, K2 and/or one or two magnetic resonance imaging system plugs St3, St4, etc.). As a result, all RF transmission portions may be produced suitably by structures that may be created on PCBs (e.g., multilayer PCBs). By way of example, "unisex" plugs and sockets having flat surfaces O3, O4, as in FIG. 1, may arise as a result.

Spacers and/or elements for a DC transmission Di in the plugs St1, St2, St3, St4 may extend, for example, as far as this surface and may possibly make contact upon the connection of two magnetic resonance imaging system plugs (St1, St2; St3, St4; St5; St6) (magnetic resonance imaging system plugs discussed here may generally be male or female (sockets)). Elements EK, EI for a capacitive or inductive transmission may not extend as far as a surface, for example. The surfaces may also be flat insofar as no pin or other element of a magnetic resonance imaging system plug St1, St2; St3, St4; St5; St6 (e.g., plugs) projects beyond this (possibly imaginary) flat surface O3, O4 (e.g., possibly imaginary flat surface).

On such a flat surface structure, there are no elevated structure portions that may easily be bent. The contact areas KF may be coated with a dielectric, such that direct contact with skin/humans is not possible, and a robust and scratch-resistant surface without open metallic structures arises.

This embodiment may be advantageous in the case of, for example, use of at least one magnetic resonance imaging system plug St1, St2; St3, St4; St5; St6 at one or a plurality of docking sites (e.g., docking sites for connecting cables of a local coil to an interface St1-St2 at a patient couch 104) of a mobile MR patient couch 104. The mechanical tolerances that the two printed circuit boards of two magnetic resonance imaging system plugs St1, St2; St3, St4; St5; St6 (formerly plug and socket) have with respect to one another there with readily controllable tolerance may be adjustable, and low vibrations can prevail. This embodiment may also be advantageous in the case of use at the coil plug St4 of a local coil 106 (as in FIG. 5), use together with plug connectors Di from technology known in other fields for the transmission of DC voltage DC in a magnetic resonance imaging system plug St1, St2; St3, St4; St5; St6 or in connection systems separate therefrom, use together with transmission methods that react possibly with little sensitivity to variation of the reflection loss of the plug connector (e.g., digital transmission, FM, phase modulation)

A large part of the docking site of a patient couch 104 of an MRI 101 may be usable with such a technique, particularly if the tune/detune signals (e.g., for reception readiness switching (for signals Si from a body)/detuning (for RF signals transmitted by a body coil)) for antennas Ant in, for example, a local coil 106 may be distributed/transmitted thereby or differently, which may be the subject of other considerations. A similar situation may also apply in suitable form to a coil plug St4, St2 of a local coil 106.

In the case of a transmission with inductive structures EI, looped structures may be provided on both sides of the plug connection (e.g., in magnetic resonance imaging system plugs St3, St4) in order to generate the B-fields and to couple the B-fields, for example, by a dielectric. In the case of the transmission by capacitive methods, for example, planar structures EK for generating the E-fields are provided in a magnetic resonance imaging system plug St3 that may be connected to another magnetic resonance imaging system plug St4.

The embodiment may also be advantageous together with a spring mechanism F indicated in the figures, by which the two surfaces are pressed against one another in a planar manner and/or brought to a defined distance by a spacer Di.

The fixing or clamping apparatus (e.g., with a spring of an abovementioned spring mechanism F) may serve to provide that vibrations that occur during an MRI imaging at the MRI system 101 are not transmitted to the magnetic resonance imaging system plug St1-St5 such that the RF properties (e.g., scattering parameters: s11, s21) thereof change in a relevant way.

In one or more of the present embodiments, the costs for RF connection technology and for increasing the robustness thereof are reduced. One solution may be based on non-galvanic, but rather field-coupled (inductively, B-field) or capacitively (E-field) based transmission.

A field-coupled transmission of signals (B1($x, y, z, t$), Si, T, R) is, for example, a galvanically isolated transmission of signals (B1($x, y, z, t$), Si, T, R) and/or transmission by a field (e.g., between elements of two magnetic resonance imaging system plugs that have been plugged together) and/or an inductive or capacitive transmission.

Figure 1:
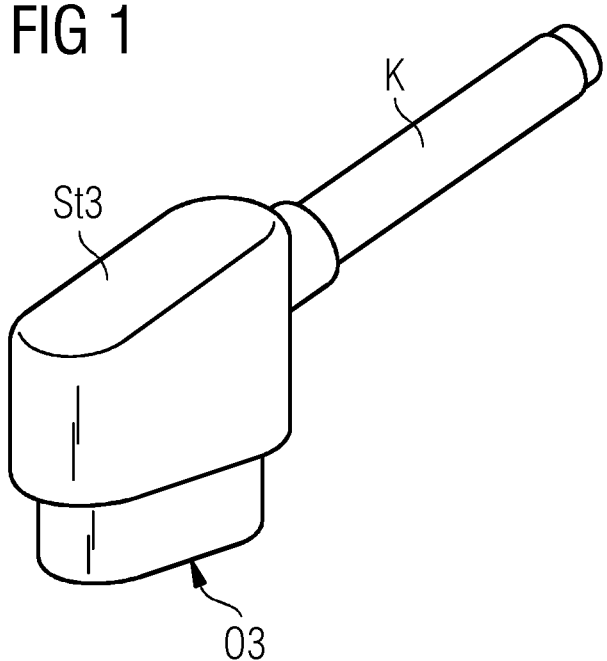
FIG. 1 shows one embodiment of a magnetic resonance imaging system plug.

FIG. 1 shows an example of one (St3) of the magnetic resonance imaging system plugs at one end of a cable K and having a flat "surface" O3.

Figure 2:
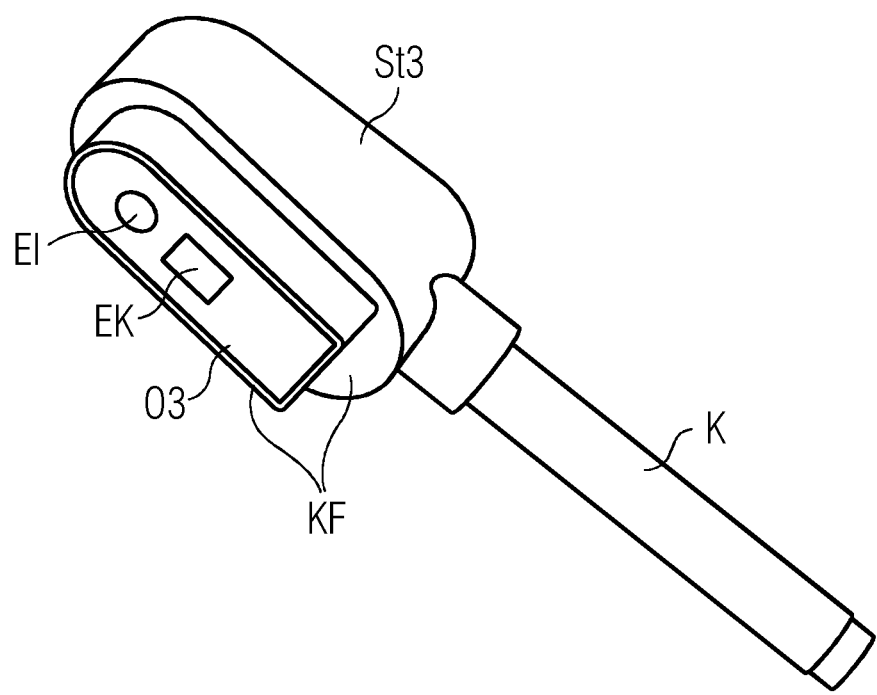
FIG. 2 shows one embodiment of a magnetic resonance imaging system plug.

FIG. 2 shows one embodiment of a magnetic resonance imaging system plug St3 in a plan view of the "flat" surface O3 thereof, such that elements EI in the magnetic resonance imaging system plug St3 for capacitively transmitting (RF) signals to precisely such elements in a further magnetic resonance imaging system plug (St4) (e.g., plugged onto the magnetic resonance imaging system plug St3) and spacers Di are visible.

Figure 3:
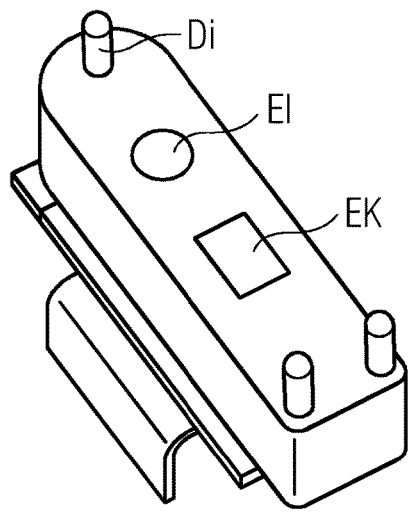
FIG. 3 shows one embodiment of a magnetic resonance imaging system plug.

FIG. 3 shows one embodiment of a magnetic resonance imaging system plug St3 in a plan view of the "flat" surface O3 thereof, but without the plug housing thereof.

Figure 4:
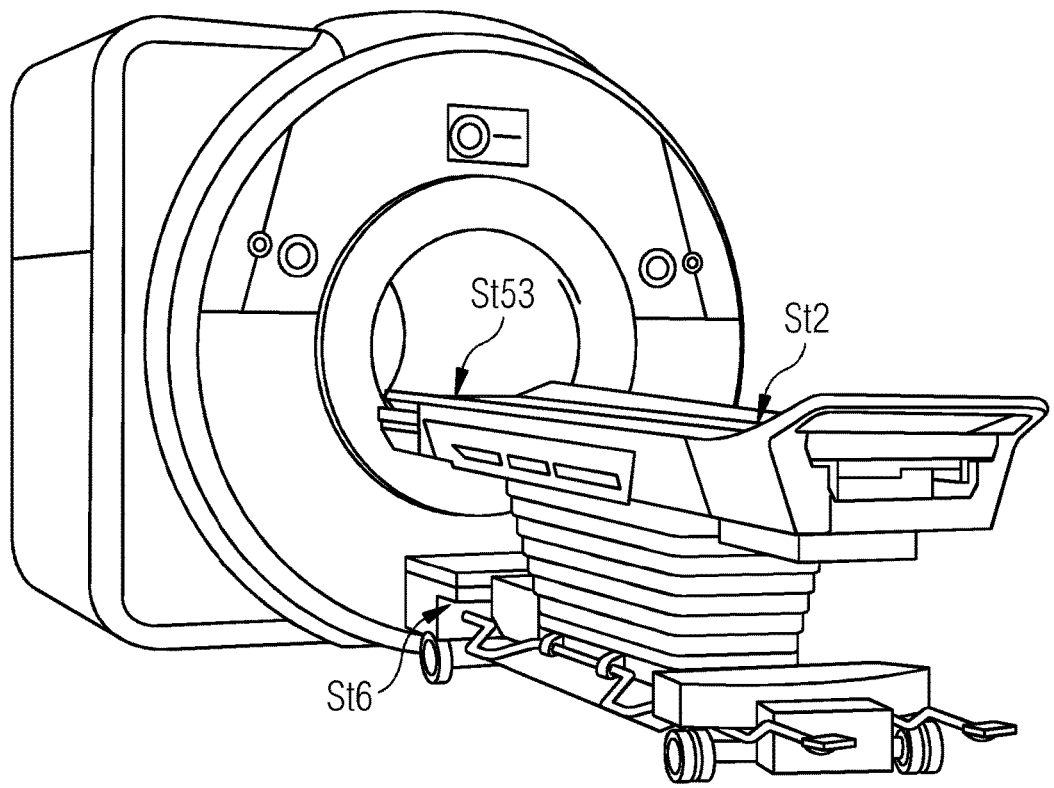
FIG. 4 shows one embodiment of an MRI with a patient couch with a plurality of magnetic resonance imaging system plugs or sockets.

FIG. 4 shows one embodiment of an MRI 101 including a patient couch 104 with a plurality of magnetic resonance imaging system plugs St2, St3, St6 that in each case enable a magnetic resonance imaging system connection for the transmission of signals through the plurality of magnetic resonance imaging system plugs St2, St3, St6.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance imaging (MRI) system connection for art MRI system, the MRI system connection comprising:
    one or two MRI system plugs; and
    a fixing or clamping apparatus in order that vibrations that are occurrable during an MRI imaging at the MRI system are not transmitted to the MRI system plugs such that RF properties thereof change or change to an extent relevant to the field-coupled transmission,
    wherein the MRI system connection is configured with devices for a field-coupled transmission of signals.

2. The MRI system connection of claim 1, wherein the MRI system comprises an MRI local coil, a patient couch, or the MRI local coil and the patient couch.

3. The MRI system connection of claim 1, wherein the MRI system connection is configured with devices for an inductive field-coupled transmission of signals in at least one MRI system plug of the one or two MRI system plugs for the inductive field-coupled transmission of signals.

4. The MRI system connection of claim 1, wherein the MRI system connection is configured with devices for a capacitive field-coupled transmission of signals in at least one MRI system plug of the one or two MRI system plugs for the capacitive field-coupled transmission of signals.

5. The MRI system connection of claim 1, wherein the MRI system connection is configured with devices for a field-coupled galvanically isolated transmission, a non-conductively connected transmission, or a field-coupled galvanically isolated and non-conductively connected transmission in at least one MRI system plug of the one or two MRI system plugs.

6. The MRI system connection of claim 1, wherein the MRI system connection is configured for a field-coupled galvanically isolated transmission, a non-conductively connected transmission, or a field-coupled galvanically isolated and non-conductively connected transmission of RF signals by at least one MRI system plug of the one or two MRI system plugs.

7. The MRI system connection of claim 1, wherein each of the one or two MRI system plugs is formed at a respective end of a respective cable of the MRI system connection.

8. The MRI system connection of claim 1, wherein one or both of the one or two MRI system plugs comprise one or a plurality of printed circuit boards (PCBs) or multilayer PCBs.

9. The MRI system connection of claim 1, wherein one or both of the one or two MRI system plugs are unisex plugs and sockets.

10. The MRI system connection of claim 1, wherein a contact side, of the one or two MRI system plugs is configured for an inductive or capacitive transmission without elevated structure portions, with flat surfaces on the contact side of the one or two MRI system plugs, or a combination thereof.

11. The MRI system connection of claim 1, wherein the one or two MRI system plugs are coated with a dielectric on a contact side of the one or two MM system plugs.

12. The MRI system connection of claim 1, wherein the MRI system connection is configured for plugging in at a docking site of an MRI patient couch.

13. The MRI system connection of claim 1, wherein the MRI system connection is configured for plugging in at a local coil.

14. The MRI system connection of claim 1, wherein the MRI system connection runs through a cable, the one or two MRI system plugs, or a combination thereof.

15. The MRI system connection of claim 1, wherein at least one MRI system plug of the one or two MRI system plugs is configured for transmission of RF signals via a galvanically isolated transmission, galvanically non-isolated plug connectors for transmission of DC voltage, tune/detune signals for reception readiness switching or detuning of antennas of a local coil, or the DC voltage and the tune/detune signals, or a combination thereof.

16. The MRI system connection of claim 1, wherein the MRI system connection is configured for galvanically isolated transmission of RF signals using digital transmission; frequency modulation, phase modulation, or any combination thereof.

17. The MRI system connection of claim 1, comprising, for a capacitive field-coupled transmission by at least one MRI system plug of the one or two MRI system plugs, planar structures for generating E-fields.

18. A magnetic resonance imaging system comprising:
   one or more magnetic resonance imaging system connections,
   wherein each of the one or more magnetic resonance imaging system connections includes a spring mechanism, by which two surfaces of two magnetic resonance imaging system plugs to be connected to one another are pressed against one another in a planar manner, are kept at a defined distance by a spacer, or a combination thereof, and
   wherein each of the one or more magnetic resonance imaging system connections is configured with devices for a field-coupled transmission of signals.

19. A magnetic resonance imaging (MRI) system connection for an MRI system, for an inductive field-coupled transmission of signals by at least one magnetic resonance imaging system plug, the MRI system connection comprising:
   looped structures on both sides of a plug connection at two magnetic resonance imaging system plugs in order to generate B-fields and to couple the B-fields by a dielectric,
   wherein the MRI system connection is configured with devices for a field-coupled transmission of signals.

20. A magnetic resonance imaging (MRI) system connection for an MRI system, the MRI system connection comprising:
   a spring mechanism, by which two surfaces of two magnetic resonance imaging system plugs to be connected to one another are pressed against one another in a planar manner, are kept at a defined distance by a spacer, or a combination thereof,
   wherein the MRI system connection is configured with devices for a field-coupled transmission of signals.

* * * * *